(12) United States Patent   (10) Patent No.: US 7,763,145 B2
Park                        (45) Date of Patent:     Jul. 27, 2010

(54) SYSTEM FOR REMOVAL OF AN INTEGRATED CIRCUIT FROM A MOUNT MATERIAL

(75) Inventor: Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 1090 days.

(21) Appl. No.: 11/276,945

(22) Filed: Mar. 17, 2006

(65) Prior Publication Data

US 2007/0215672 A1    Sep. 20, 2007

(51) Int. Cl.
B32B 38/10        (2006.01)
(52) U.S. Cl. ............... 156/344; 156/584; 438/464; 438/976
(58) Field of Classification Search .......... 156/344, 156/584; 438/464, 976
See application file for complete search history.

(56) References Cited

U.S. PATENT DOCUMENTS

| 4,820,369 | A | 4/1989 | Kubo |
| 4,990,051 | A | 2/1991 | Safabakhsh et al. |
| 6,189,591 | B1 * | 2/2001 | Ariye et al. ................ 156/584 |
| 6,290,805 | B1 * | 9/2001 | Freund et al. .............. 156/344 |
| 6,505,395 | B1 | 1/2003 | Farnworth et al. |
| 6,629,553 | B2 * | 10/2003 | Odashima et al. ........... 156/584 |
| 6,869,264 | B2 | 3/2005 | Yoo |
| 6,930,387 | B2 | 8/2005 | Carr et al. |
| 7,192,843 | B2 * | 3/2007 | Kito ........................ 438/458 |
| 2004/0173322 | A1 * | 9/2004 | Yen et al. .................. 156/584 |
| 2009/0035105 | A1 * | 2/2009 | Yoon et al. ............ 414/225.01 |

* cited by examiner

Primary Examiner—Mark A Osele
(74) Attorney, Agent, or Firm—Mikio Ishimaru

(57) ABSTRACT

A system for removal of an integrated circuit from a mount material including holding and stretching the mount material using linear and rotary motion, and removing the integrated circuit from the mount material when the mount material is stretched by linear and rotary motion.

18 Claims, 6 Drawing Sheets

SYSTEM FOR REMOVAL OF AN INTEGRATED CIRCUIT FROM A MOUNT MATERIAL

TECHNICAL FIELD

The present invention relates generally to systems for removal, and more particularly to a system for removal of an integrated circuit.

BACKGROUND ART

Recently, thin semiconductor die handling has become a key factor with high-density packages. Today's trend in the semiconductor assembly industry is to put denser and higher performing semiconductor die in one package. IC die are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. As consumers continue to demand higher performance and lower cost products, semiconductor die or integrated circuit ("IC") die are increasing in density as well as packaging density. Increasing functions, decreasing numbers of components and thicknesses, make IC die more susceptible to damage during manufacturing handling and use.

IC packaging technology has shown an increase in semiconductor chip density (the number of chips mounted on a single circuit board or base leadframe) that parallels the reduction in the number of components that are needed for a circuit. This results in packaging designs that are more compact, in form factors (the physical size and shape of a device) that are more compact, and in a significant increase in overall IC density. With increasing density, the area of a single IC die is also increasing in order to add functions and reduce component numbers. The IC die area has increased to the point that the adhesive force holding the die during processing cannot consistently be overcome without causing some damage to the IC die when it needs to be removed. If a die eject force becomes too great, the IC die can be damaged. If a die eject force is reduced, the die cannot be removed.

Current methods have confronted a wall because of IC die damage while peeling mount material during processing. High costs in attempting to solve mount material removal have plagued some attempts, such as radiation removal methods. The require mount material as well as the removal processes including removal apparatus are very expensive. Dropped and damaged IC die have plagued other attempts. IC die are in a tilted position during uneven release methods such that a pick-up apparatus has an insufficient hold on the IC die. The insufficient hold results in dropping and contaminating or otherwise damaging the IC die. Force from a needle pushing the IC die ends up cracking or breaking the IC die. In the case where the IC die does not break, the needle also scores or chips the IC die rendering the circuitry in those areas useless and resulting in a non-functional IC die.

Despite the many and various attempts to improve mount material removal from the IC die, problems such as breakage, damage and high costs continue to plague semiconductor assembly technology. The increasing demands from consumers for higher performance and lower cost products have confronted mount material removal. Thinning IC die, increasing IC density and IC die area, have only complicated the many problems plaguing mount material removal. High costs for materials and processes as well as low manufacturing yields due to breakage and damage, severely limit capabilities and capacities. Limited capabilities and capacities impose acute constraints in accommodating additional functions, higher performance, and lower cost products.

Thus, a need still remains for a support system for peeling thin integrated circuit die to provide improved handling, reliability and manufacturing yield. In view of the increasing demand for improved density of integrated circuits, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a system for removal of an integrated circuit from a mount material, holding and stretching the mount material using linear and rotary motion, and removing the integrated circuit from the mount material when the mount material is stretched by linear and rotary motion.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
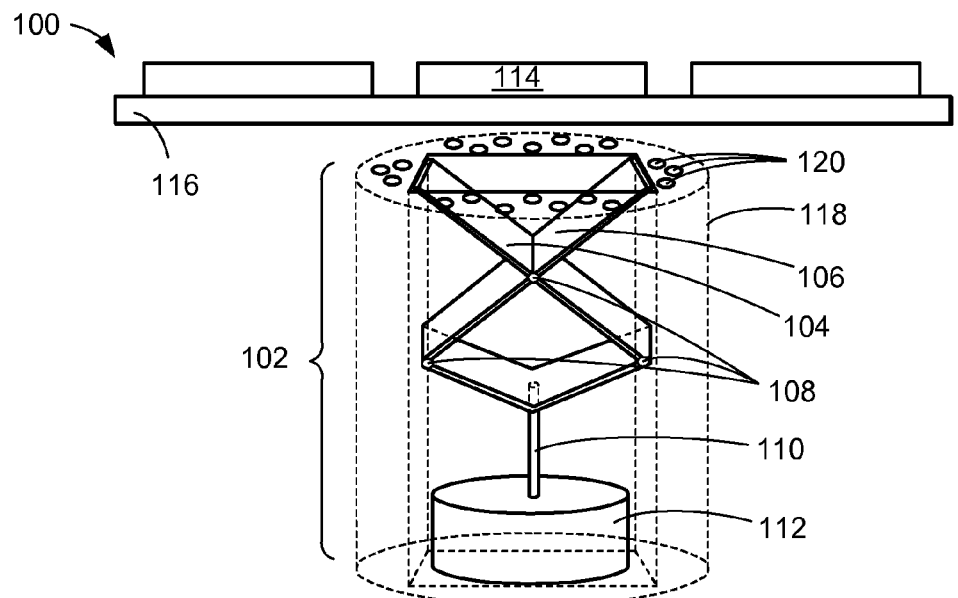
FIG. 1 is an isometric view of a system for removal of an integrated circuit in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the invention with surfaces as oriented downward, this arrangement in the FIGS. is arbitrary and is not intended to suggest that invention should necessarily be in a downward direction. Generally, the device can be operated in any orientation. In addition, the same numbers are used in all the drawing FIGS. to relate to the same elements.

The term "horizontal" as used herein is defined as a plane parallel to the conventional plane or surface of the invention, regardless of its orientation. The term "vertical" refers to a direction perpendicular to the horizontal as just defined. The term "on" refers to direct contact among elements. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown an isometric view of a system for removal of an integrated circuit 100 in an embodiment of the present invention. The system for removal of an integrated circuit 100 includes a removal device 102 having a first blade 104 and a second blade 106, such as scissors blades. The removal device 102 also includes a pivot 108, such as a movable pivot or an immovable pivot, and a shaft 110, such as an up-down shaft. The shaft 110 may be attached to a base 112, such as platform, an interface to a motion generator or a motion generator.

An integrated circuit die 114 is attached to a mount material 116, such as tape or foil. The removal device 102 may also include a housing 118, such as a suction housing, having holes 120, such as vacuum holes. The housing 118 may provide a surface for the mount material 116 and the integrated circuit die 114. The holes 120 may provide a vacuum for holding the mount material 116 and the integrated circuit die 114 on the surface of the housing 118.

The system for removal of an integrated circuit 100 applies a removal process, such as peeling, to the mount material 116 from the integrated circuit die 114. Movement of the removal device 102 provides indirect force, such as stretching force, to remove the mount material 116 from the integrated circuit die 114. The first blade 104 and the second blade 106 provide removal and the housing 118 provides a substantially fixed position of the mount material 116 and the integrated circuit die 114. The removal process provides dispersed physical stress, such as indirect force or fictitious force, to prevent damage to the integrated circuit die 114.

Figure 2:
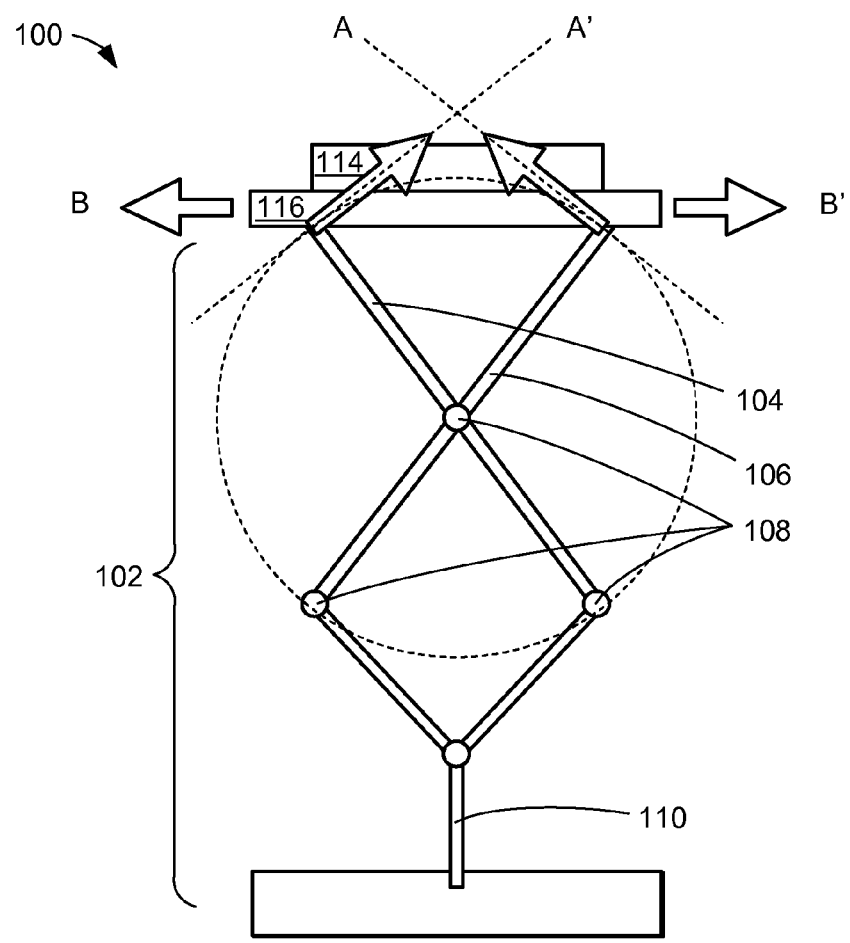
FIG. 2 is a side plan view of the system for removal of an integrated circuit.

Referring now to FIG. 2, therein is shown a side plan view of the system for removal of an integrated circuit 100. The first blade 104 provides a first removal force in a substantially linear direction along the line A. In a similar manner the second blade 106 provides a second removal force in a substantially linear direction along the line A'. The first removal force may be applied by the first blade 104 in a direction partially opposite a first tape expansion direction B as well as rotary movement. Similarly, the second removal force may be applied by the second blade 106 in a direction partially opposite a second tape expansion direction B' and rotary movement.

The first blade 104 and the second blade 106 optionally provide movement relative to one another allowing the first removal force and the second removal force to disperse across a width, a diameter or a chord of the integrated circuit die 114. The first removal force and the second removal force along with rotary movement apply indirect force to disperse stress on the integrated circuit die 114 across the range of linear and rotary motion for removing the mount material 116. For illustrative purposes the pivot 108 is shown as a circular connection although it is understood that they may be different. Further, the pivot 108 may be moveable or immoveable. It has been discovered that dispersed physical stress on the integrated circuit die 114 significantly reduces damage or breakage of the integrated circuit die 114.

Figure 3:
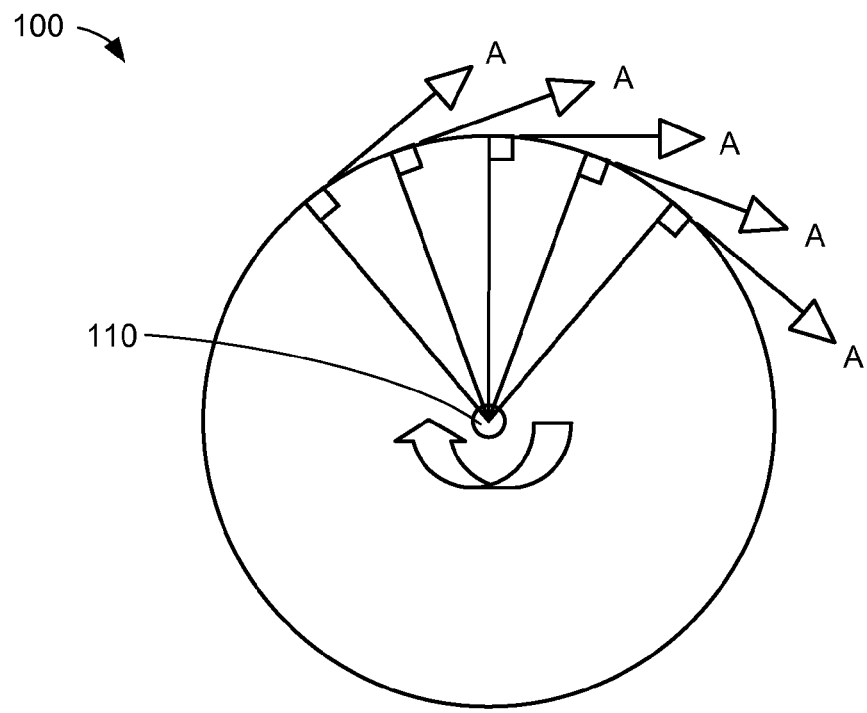
FIG. 3 is a top plan view of the system for removal of an integrated circuit.

Referring now to FIG. 3, therein is shown a top plan view of the system for removal of an integrated circuit 100. The top plan view shows a rotary motion of the first blade 104 of FIG. 1 including a force diagram depicting a force A, such as a real force based on centrifugal force. The force A is substantially perpendicular to a radius from the shaft 110 to an end of the first blade 104. A tail or origin of the force A is at the end of the first blade 104 and the force A is a tangent of the rotary motion described by the following equation where $\omega$=angular momentum.

$$F = mr\omega^2 = mv^2/r = \text{Force A}$$

The rotary movement of the first blade 104 provides the force A that may be applied to the mount material 116 of FIG. 1 along the line A of FIG. 2. The force A is applied at the tangent of the rotary movement and across the range of the rotary movement. A magnitude of the force A depends on a velocity of the first blade 104. Increasing the velocity of the rotary movement increases the force A, and conversely, decreasing the velocity decreases the force A. For illustrative purposes, the force A is shown in multiple positions although it is understood that the force A is in one position at a given time. Further, for illustrative purposes, the rotary movement is shown as a circular clockwise movement although it is understood that the rotary movement may be different as well.

Figure 4:
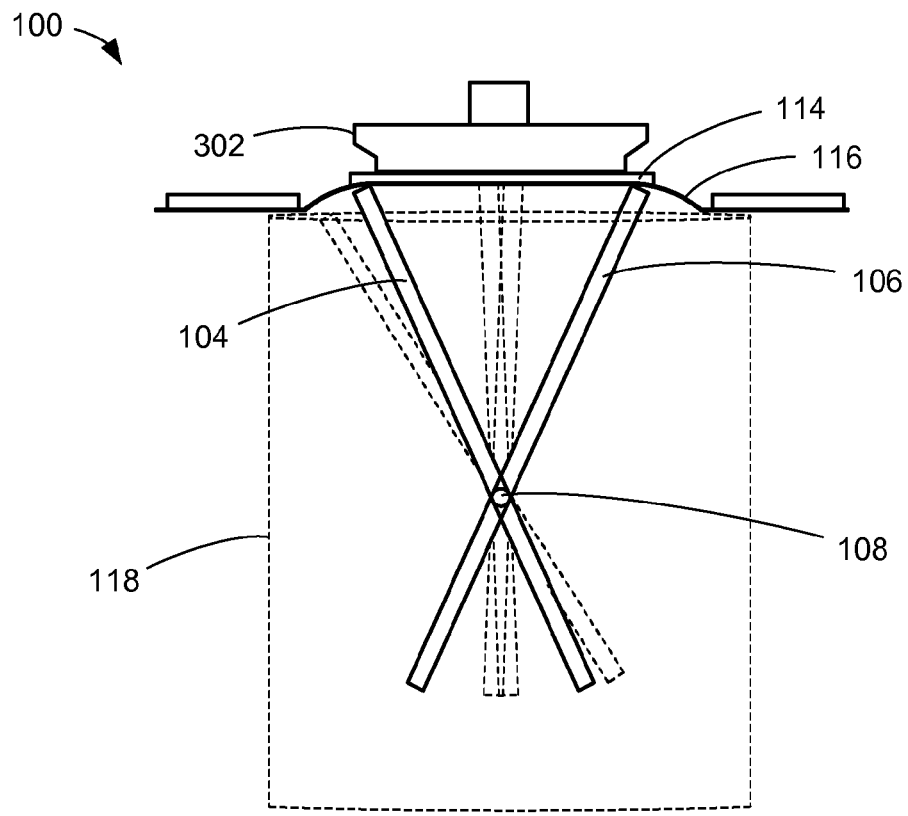
FIG. 4 is a side view of the system for removal of an integrated circuit in a blade-rotating phase.

Referring now to FIG. 4, therein is shown a side view of the system for removal of an integrated circuit 100 in a blade-rotating phase. A die pick-up device 302 is shown over the integrated circuit die 114 to pick up the integrated circuit die 114 from the mount material 116. The first blade 104 and the second blade 106 are rotated about an axis substantially perpendicular to the integrated circuit die 114. Moving the first blade 104, against the mount material 116 near an edge of the integrated circuit die 114, provides the force A of FIG. 3 and the first removal force of FIG. 2. Similarly, the second blade 106 provides indirect force to the mount material 116 and the integrated circuit die 114.

The first blade 104 optionally moves about the pivot 108 to apply the first removal force to additional portions of the mount material 116. In a similar manner, the second blade 106 optionally moves about the pivot 108 to apply the second removal force of FIG. 2 to additional portions of the mount material 116. The housing 118 holds a portion of the mount material 116, which may include additional integrated circuit die. It has been discovered that the rotary motion applies indirect force to disperse physical stress to the integrated circuit die 114 and remove the mount material 116.

Figure 5:
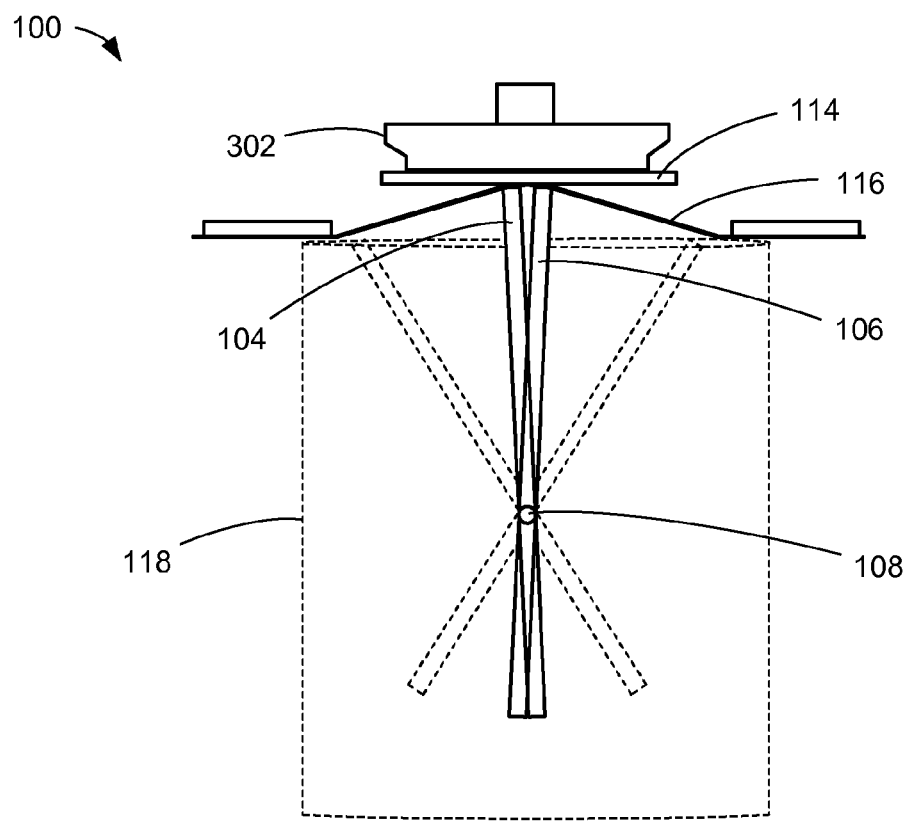
FIG. 5 is a side view of the system for removal of an integrated circuit in an edge-peeling phase.

Referring now to FIG. 5, therein is shown a side view of the system for removal of an integrated circuit 100 in an edge-peeling phase. The die pick-up device 302 lifts the integrated circuit die 114 off the mount material 116. Indirect force moves the mount material 116 away from the integrated circuit die 114 and disperses physical stress to the integrated circuit die 114. Dispersing physical stress prevents damage in particular with thin integrated circuit die below 50 um in thickness.

The first blade 104 and the second blade 106 are rotated about an axis substantially perpendicular to the integrated circuit die 114, for edge peeling on all sides. Optional movement about the pivot 108 applies the first removal force of FIG. 2 and the second removal force of FIG. 2. The housing 118 holds a portion of the mount material 116, which may include additional integrated circuit die, while the first blade 104 and the second blade 106 stretch the mount material 116 to a point allowing removal of the integrated circuit die 114. The rotary motion, the first removal force, and the second removal force apply indirect force to remove the mount material 11 6.

Figure 6:
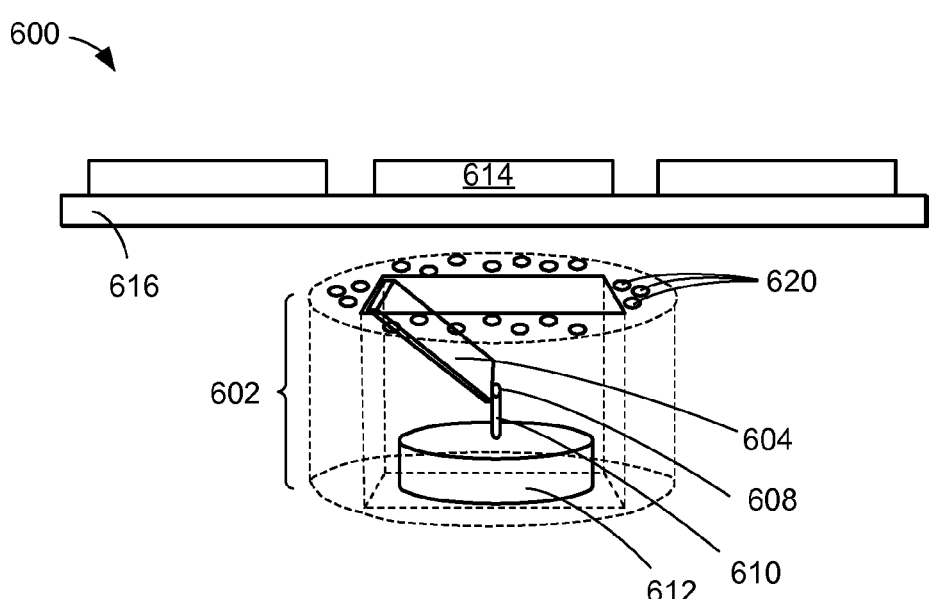
FIG. 6 is an isometric view of a system for removal of an integrated circuit in an alternative embodiment of the present invention.

Referring now to FIG. 6, therein is shown an isometric view of a system for removal of an integrated circuit 600 in an alternative embodiment of the present invention. The system for removal of an integrated circuit 600 includes a removal device 602 having a single blade 604, such as scissors blades. The removal device 602 also includes a pivot 608, such as a movable pivot or an immovable pivot, and an option of a shaft 610, such as an up-down shaft. The shaft 610 may be attached to an option of a base 612, such as platform, an interface to a motion generator or a motion generator.

An integrated circuit die 614 is attached to a mount material 616, such as tape or foil. The removal device 602 may also include a housing 618, such as a suction housing, having holes 620, such as vacuum holes. The housing 618 may provide a surface for the mount material 616 and the integrated circuit die 614. The holes 620 may provide a vacuum for holding the mount material 616 and the integrated circuit die 614 on the surface of the housing 618.

The system for removal of an integrated circuit 600 applies a removal process, such as peeling, to the mount material 616 from the integrated circuit die 614. Movement of the removal device 602 provides indirect force to remove the mount material 616 from the integrated circuit die 614. The single blade 604 provides removal and the housing 618 provides a substantially fixed position of the mount material 616 and the integrated circuit die 614. The removal process provides dispersed physical stress, such as indirect force or fictitious force, to prevent damage to the integrated circuit die 614.

Figure 7:
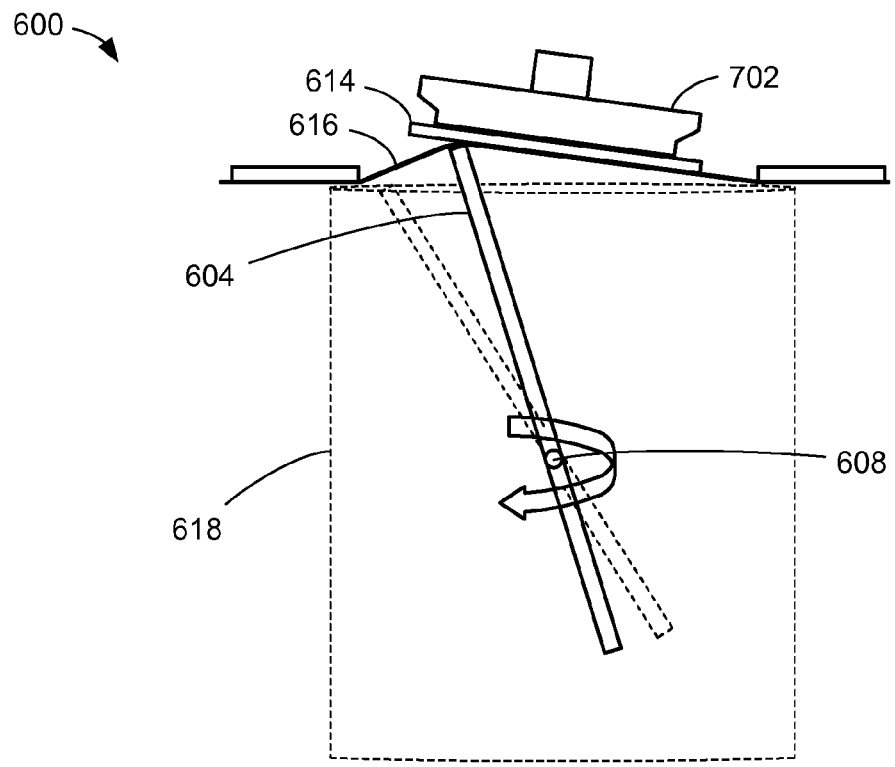
FIG. 7 is a side view of the system for removal of an integrated circuit in a blade-rotating phase.

Referring now to FIG. 7, therein is shown a side view of the system for removal of an integrated circuit 600 in a blade-rotating phase. A die pick-up device 702 is shown over the integrated circuit die 614 to pick up the integrated circuit die 614 from the mount material 616. The single blade 604 is rotated about an axis substantially perpendicular to the integrated circuit die 614. Moving the single blade 604, against the mount material 616 near an edge of the integrated circuit die 614, provides a force similar to the force A of FIG. 3 and a removal force similar to the first removal force of FIG. 2.

The single blade 604 optionally moves about the pivot 608 to apply the removal force to additional portions of the mount material 616. The housing 618 holds a portion of the mount material 616, which may include additional integrated circuit die. It has been discovered that the rotary motion applies indirect force to disperse physical stress to the integrated circuit die 614 and remove the mount material 616.

Figure 8:
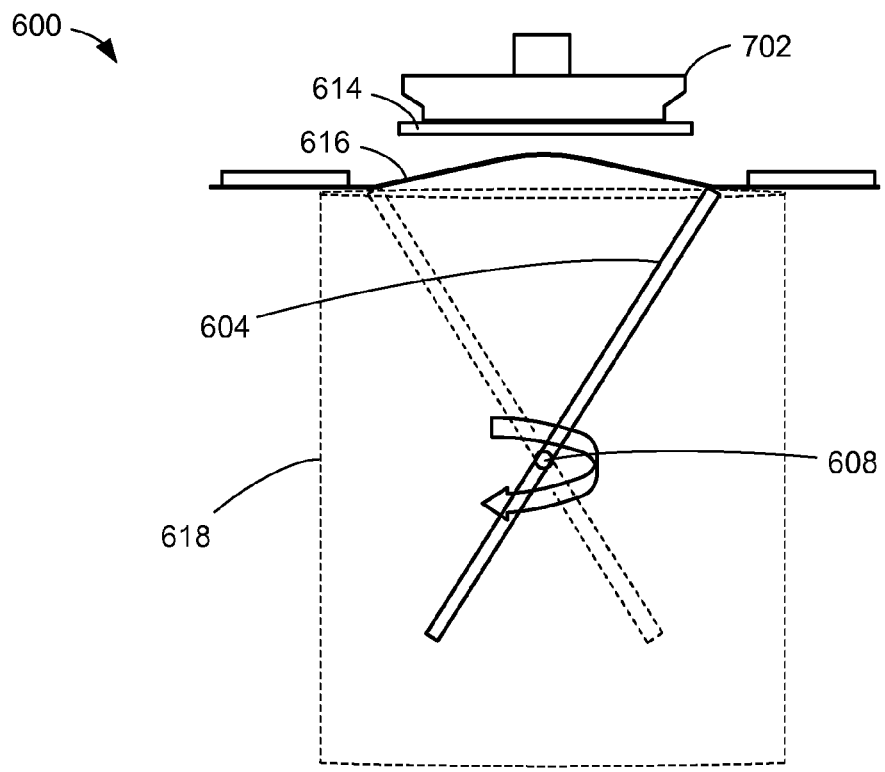
FIG. 8 is a side view of the system for removal of an integrated circuit in an edge-peeling phase.

Referring now to FIG. 8, therein is shown a side view of the system for removal of an integrated circuit 600 in an edge-peeling phase. The die pick-up device 702 lifts the integrated circuit die 614 off the mount material 616. Indirect force moves the mount material 616 away from the integrated circuit die 614 and disperses physical stress to the integrated circuit die 614. Dispersing physical stress prevents damage in particular with thin integrated circuit die below 50 um in thickness.

The single blade 604 is rotated about an axis substantially perpendicular to the integrated circuit die 614, for edge peeling on all sides. Optional movement about the pivot 608 applies a removal force similar to the first removal force of FIG. 2. The housing 618 holds a portion of the mount material 616, which may include additional integrated circuit die, while the first blade 104 and the second blade 106 stretch the mount material 116 to a point allowing removal of the integrated circuit die 114. The rotary motion and the removal force apply indirect force to remove the mount material 616.

Figure 9:
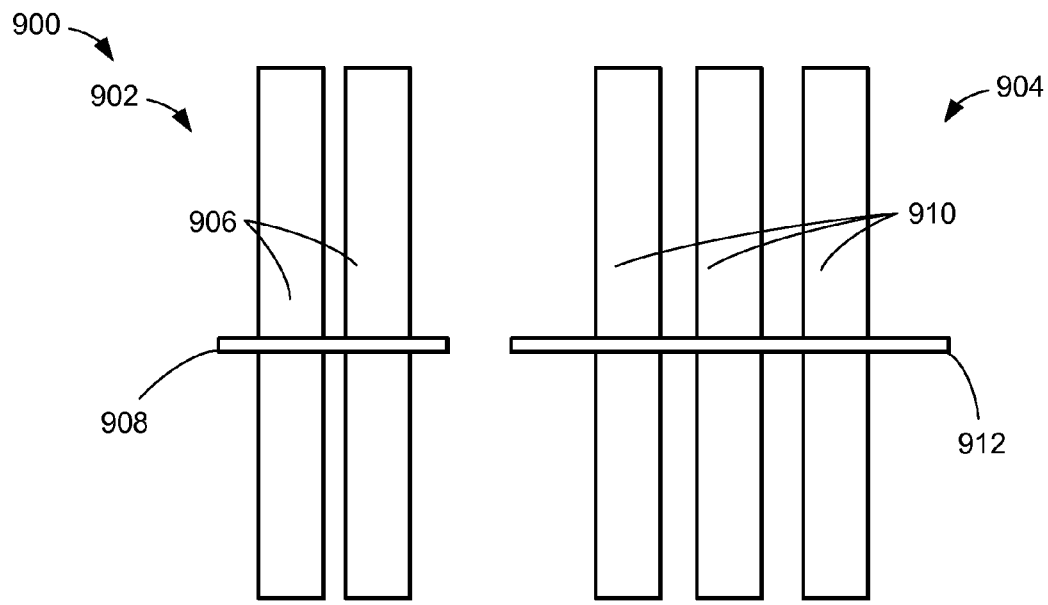
FIG. 9 is a plan view of finger blade assemblies.

Referring now to FIG. 9, therein is shown a plan view of finger blade assemblies 900. One or more of the finger blade assemblies 900 may optionally be used in the system for removal of an integrated circuit 100 or the system for removal of an integrated circuit 600. The finger blade assemblies 900 include a first finger blade assembly 902 and a second finger blade assembly 904. The first finger blade assembly 902 includes first finger blades 906 and a first finger pivot 908. In a similar manner, the second finger blade assembly 904 includes second finger blades 910 and a second finger pivot 912. Tips or ends of the first finger blades 906 and the second finger blades 910 are optionally processed or grooved such as uneven, rough, or sharp for improved performance.

The first finger blades 906 and the second finger blades 910 may optionally be spaced on the first finger pivot 908 and the second finger pivot 912 respectively to provide interleaving, similar to two combs with their respective teeth crossed. The first finger blades 906 are positioned to provide spacing for alternating instances of the second finger blades 910. Similarly, the second finger blades 910 are positioned to provide spacing for alternating instances of the first finger blades 906. For illustrative purposes, two instances of the first finger blades 906 and three instances of the second finger blades 910 are shown although it is understood that any number of finger blades may be used.

Figure 10:
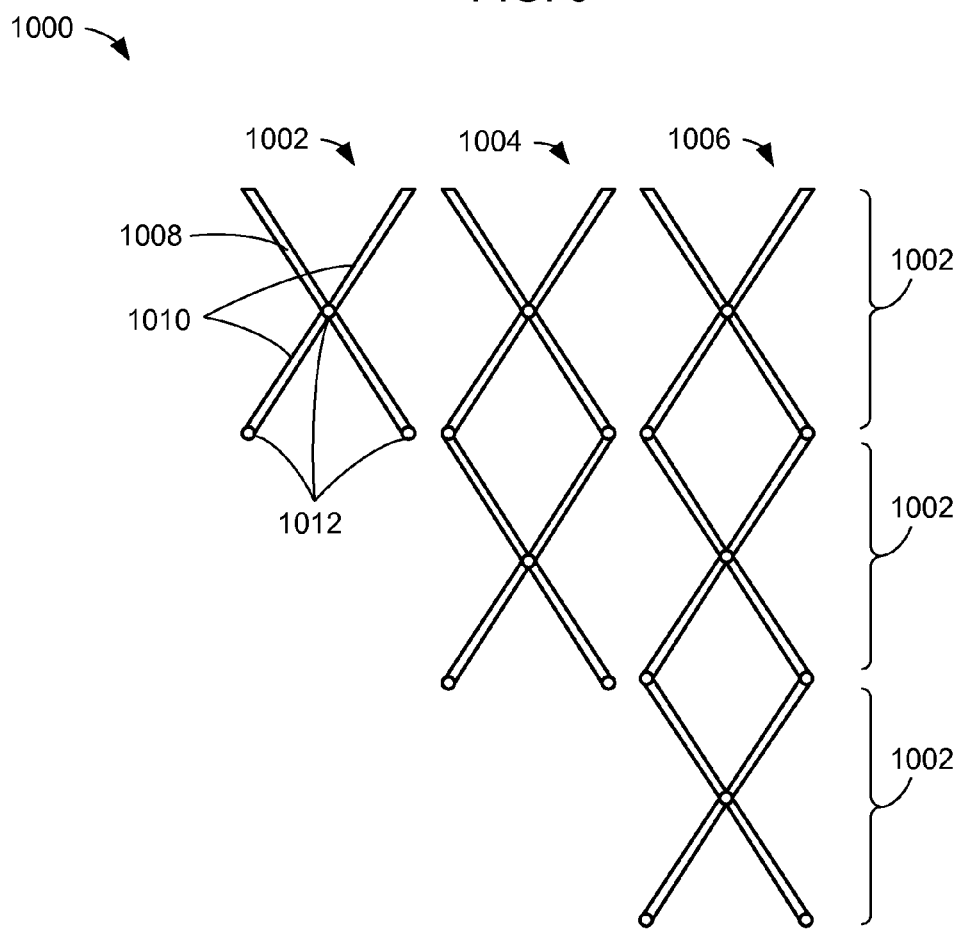
FIG. 10 is a plan view of scissor blade assemblies.

Referring now to FIG. 10, therein is shown a plan view of scissor blade assemblies 1000. One or more of the scissors assemblies may optionally be used in the system for removal of an integrated circuit 100. The scissor blade assemblies 1000 include a first scissor blade assembly 1002, a second scissor blade assembly 1004 and a third scissor blade assembly 1006. The first scissor blade assembly 1002 includes a first scissor blade 1008 and a second scissor blade 1010 each having two sections segmented by pivots 1012. The first scissor blade 1008 and the second scissor blade 1010 with the pivots 1012 provide improved mechanical properties, such as a mechanical lever or length extension.

The second scissor blade assembly 1004 includes two assemblies like the first scissor blade assembly 1002 providing four sections each of the first scissor blade 1008 and the second scissor blade 1010 segmented by the pivots 1012. Similarly, the third scissor blade assembly 1006 includes three assemblies like the first scissor blade assembly 1002 providing six sections each of the first scissor blade 1008 and the second scissor blade 1010 segmented by the pivots 1012. More than one assembly like the first scissor blade assembly 1002 provides multiples of the improvement in the mechanical properties. For illustrative purposes one, two, or three assemblies like the first scissor blade assembly 1002 are shown although it is understood that any number may be used. Further, each assembly like the first scissor blade assembly 1002 may be different.

Figure 11:
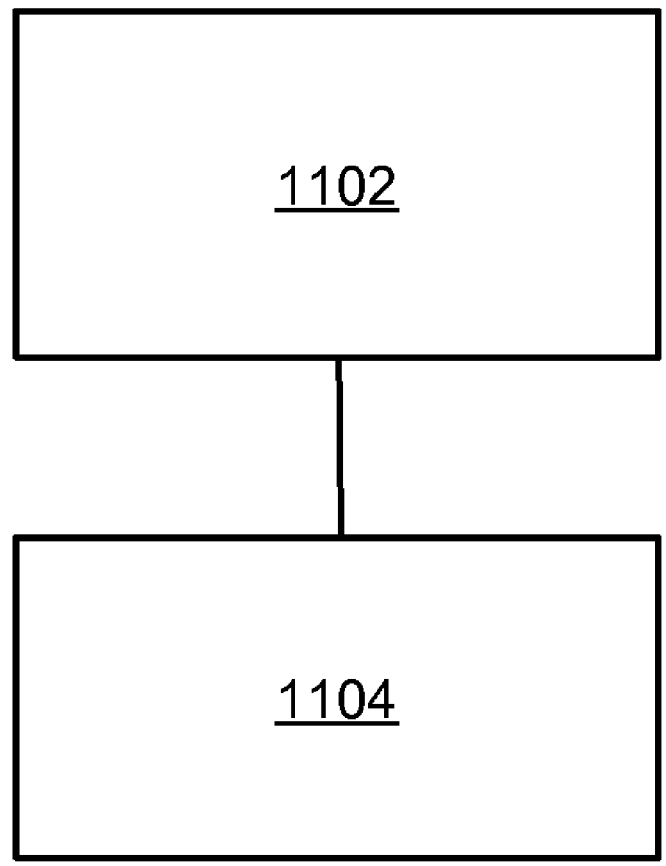
FIG. 11 is a flow chart of a system for removal of an integrated circuit for manufacturing the system for removal of an integrated circuit in an embodiment of the present invention.

Referring now to FIG. 11, therein is shown a flow chart of a system for removal of an integrated circuit 1100 for manufacturing the system for removal of an integrated circuit 100 in an embodiment of the present invention. The system 1100 includes holding and stretching the mount material using linear and rotary motion in a block 1102; and removing the integrated circuit from the mount material when the mount material is stretched by linear and rotary motion in a block 1104.

In greater detail, a method to fabricate the system for removal of an integrated circuit 100, in an embodiment of the present invention, is performed as follows:

1. Forming the removal device having a blade for removing the integrated circuit from the mount material. (FIG. 1)
2. Forming the base having the blade attached for stretching the mount material. (FIG. 1)
3. Forming the housing near the removal device and the base for holding the mount material. (FIG. 1)
4. Providing the pick-up device for lifting the integrated circuit from the mount material. (FIG. 4)

It has been discovered that the present invention thus has numerous aspects.

An aspect is that the present invention provides two effects such as up-down force by moving the blades, such as scissors blades, and centrifugal force by rotating blades. The up-down force and the centrifugal force are applied to the mount material and the integrated circuit die. One or both of the forces with the removal device, remove the mount material from the integrated circuit die.

It has been discovered that the centrifugal force depends on rotational velocity of the pivot or angular momentum. Increased blade velocity results in higher forces while decreased blade velocity results in lower forces. Adjustment of the blade velocity along with the pivot movement and rotation provides a controlled and stable removal or peeling force on the mount material and integrated circuit die.

It has also been discovered that the disclosed structure provides a fictitious force on the mount material and the integrated circuit die. Indirect forces or vectors of the up-down force and the centrifugal force are applied to the mount material and the integrated circuit die. The indirect force provides a vector differing in direction and magnitude from the actual forces resulting in a fictitious force.

Yet another discovery of the disclosed structure is dispersing physical stress of the integrated circuit die. The rotary motion moves the up-down force and the centrifugal force across the range of the rotary movement. Additionally the centrifugal force vector changes direction across the contacted points of integrated circuit die. This disperses the stress across the integrated circuit die.

Yet another discovery of the disclosed structure is reduced damage including cracking of the integrated circuit die. The indirect forces and the dispersing of the stress provide support and stability for the integrated circuit die. The support and stability significantly reduce the damage including cracking of the integrated circuit die from stresses of the mount material peeling and the lifting of the integrated circuit die.

These and other valuable aspects of the present invention consequently further the state of the technology to at least the next level.

Thus, it has been discovered that the system for removal of an integrated circuit method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method for removal of an integrated circuit from a mount material comprising:
    holding and stretching the mount material using linear and rotary motion; and
    removing the integrated circuit from the mount material when the mount material is stretched by linear and rotary motion.

2. The method as claimed in claim 1 wherein holding and stretching the mount material comprises applying a centrifugal force to the mount material.

3. The method as claimed in claim 1 wherein holding and stretching the mount material comprises applying a removal force partially opposite a mount material expansion direction.

4. The method as claimed in claim 1 wherein removing the integrated circuit comprises stretching the mount material away from the integrated circuit.

5. The method as claimed in claim 1 wherein removing the integrated circuit comprises lifting the integrated circuit off the mount material.

6. A method for removal of an integrated circuit from a mount material comprising:
    holding and stretching the mount material using linear and rotary motion;
    dispersing stretching forces across the range of linear and rotary motion; and
    removing the integrated circuit from the mount material when the mount material is stretched by linear and rotary motion.

7. The method as claimed in claim 6 wherein dispersing stretching forces comprises applying a centrifugal force across a range of the rotary motion.

8. The method as claimed in claim 6 wherein dispersing stretching forces comprises applying the stretching force across a width of a removal region.

9. The method as claimed in claim 6 wherein dispersing stretching forces comprises varying a velocity of the rotary motion.

10. The method as claimed in claim 6 wherein holding and stretching the mount material comprises applying a vacuum for holding the mount material.

11. A system for removal of an integrated circuit from a mount material comprising:
    a removal device having a scissor blade assembly for removing the integrated circuit from the mount material;
    a base having the blade attached for stretching the mount material; and
    a housing near the removal device and the base for holding the mount material.

12. The system as claimed in claim 11 wherein the base is a motion generator.

13. The system as claimed in claim 11 wherein the removal device comprises a single blade.

14. The system as claimed in claim 11 wherein:
    the removal device is a removal device having a blade for removing the integrated circuit from the mount material;
    the base is a motion generator having the blade attached for stretching the mount material;
    the housing is a housing for holding the mount material and the integrated circuit; and further comprising:
    a pick-up device for lifting the integrated circuit from the mount material.

15. The system as claimed in claim 14 wherein the removal device comprises a first scissor blade and a second scissor blade connected by a pivot.

16. The system as claimed in claim 14 wherein the motion generator comprises a rotary motion.

17. The system as claimed in claim 14 wherein the motion generator comprises a substantially up-down motion.

18. The system as claimed in claim 14 wherein the housing comprises a suction housing having vacuum holes.

* * * * *